(12) United States Patent
Lim et al.

(10) Patent No.: US 10,349,511 B2
(45) Date of Patent: Jul. 9, 2019

(54) CONDUCTIVE STRUCTURE AND MANUFACTURING METHOD THEREOF

(71) Applicant: LG CHEM, LTD., Seoul (KR)

(72) Inventors: Jin Hyong Lim, Daejeon (KR); Jin Hyuk Min, Daejeon (KR); Ki-Hwan Kim, Daejeon (KR); Chan Hyoung Park, Daejeon (KR); Ilha Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/541,983

(22) PCT Filed: Feb. 11, 2016

(86) PCT No.: PCT/KR2016/001403
§ 371 (c)(1),
(2) Date: Jul. 6, 2017

(87) PCT Pub. No.: WO2016/129937
PCT Pub. Date: Aug. 18, 2016

(65) Prior Publication Data
US 2018/0007781 A1    Jan. 4, 2018

(30) Foreign Application Priority Data

Feb. 10, 2015    (KR) ........................ 10-2015-0020520

(51) Int. Cl.
| | | |
|---|---|---|
| *H05K 1/02* | (2006.01) | |
| *H05K 1/03* | (2006.01) | |
| *H05K 3/14* | (2006.01) | |
| *G06F 3/041* | (2006.01) | |

(52) U.S. Cl.
CPC ........... *H05K 1/0213* (2013.01); *G06F 3/041* (2013.01); *H05K 1/0274* (2013.01); *H05K 1/0306* (2013.01); *H05K 3/14* (2013.01); *G06F 2203/04103* (2013.01)

(58) Field of Classification Search
CPC ... C23C 14/08; C23C 14/0036; C23C 14/087; C23C 14/185; C23C 14/0641;
(Continued)

(56) References Cited

U.S. PATENT DOCUMENTS 5,317,006 A * 5/1994 Kumar ................ C23C 14/3407
204/192.24
2010/0035034 A1   2/2010 Yin
(Continued)

FOREIGN PATENT DOCUMENTS

| CN | 103081026 A | 5/2013 |
|---|---|---|
| KR | 10-1306563 B1 | 9/2013 |

(Continued)

*Primary Examiner* — Timothy J Thompson
*Assistant Examiner* — Guillermo J Egoavil
(74) *Attorney, Agent, or Firm* — Dentons US LLP

(57) ABSTRACT

The present application relates to a conductive structure body and a manufacturing method thereof. The method for manufacturing the conductive structure body according to an exemplary embodiment of the present application includes forming a metal layer on a substrate and forming a darkening layer on the metal layer, in which the forming of the darkening layer is performed by reactive sputtering using $CO_2$.

15 Claims, 4 Drawing Sheets

(58) Field of Classification Search
CPC ..... C23C 28/34; C23C 28/345; C23C 28/321;
G02B 1/116; G06F 3/041; G06F 3/044;
G06F 3/045; G06F 2203/04103; H05K
1/02; H05K 1/03; H05K 1/0213; H05K
1/0274; H05K 1/0306; H05K 3/10; H05K
3/14; H01L 31/02168; H01L 31/022466;
H01L 31/022491
USPC .......................................... 174/256; 428/469
See application file for complete search history.

(56) References Cited

U.S. PATENT DOCUMENTS

| | | |
|---|---|---|
| 2013/0140065 A1 | 6/2013 | Koo et al. |
| 2013/0176279 A1 | 7/2013 | Chen et al. |
| 2013/0215067 A1 | 8/2013 | Hwang |
| 2014/0016278 A1* | 1/2014 | Hwang .................. G06F 3/041 361/728 |
| 2014/0251429 A1 | 9/2014 | Lim et al. |
| 2015/0212539 A1 | 7/2015 | Hong et al. |
| 2015/0223326 A1* | 8/2015 | Lim ........................ H05K 3/16 345/174 |
| 2016/0116641 A1* | 4/2016 | Minami ................. G02B 1/116 428/469 |

FOREIGN PATENT DOCUMENTS

| | | | |
|---|---|---|---|
| KR | 101306563 B1 * | 9/2013 | ..... H01L 31/022466 |
| KR | 10-2014-0046944 A | 4/2014 | |
| KR | 10-1380102 B1 | 4/2014 | |
| KR | 20140046944 A * | 4/2014 | ............. G06F 3/041 |
| KR | 20140046944 A * | 4/2014 | ............. G06F 3/041 |
| TW | 201423771 A | 6/2014 | |

* cited by examiner

[Figure 1]
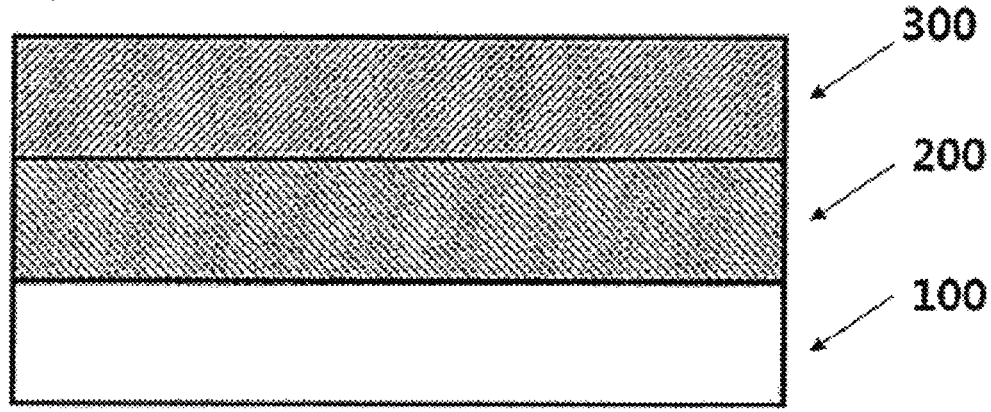
[Figure 2]
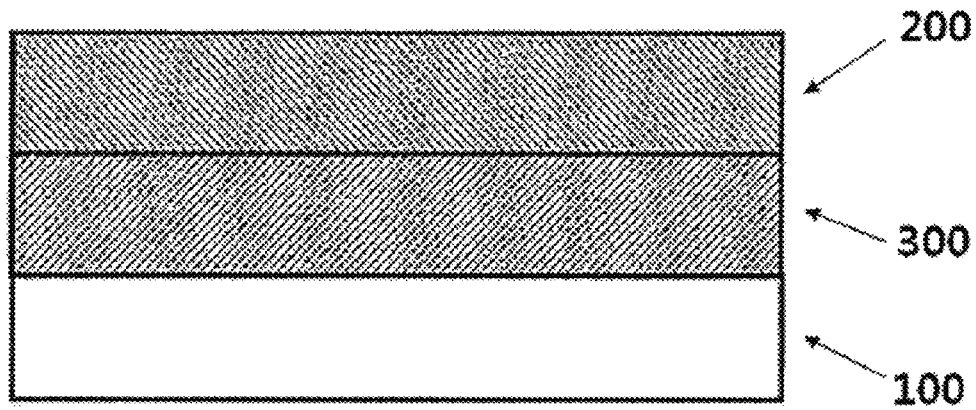

[Figure 3]
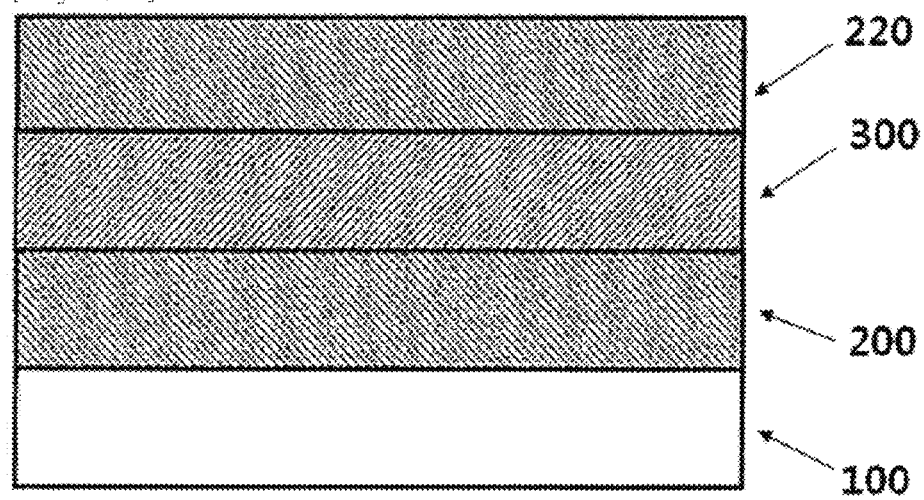
[Figure 4]
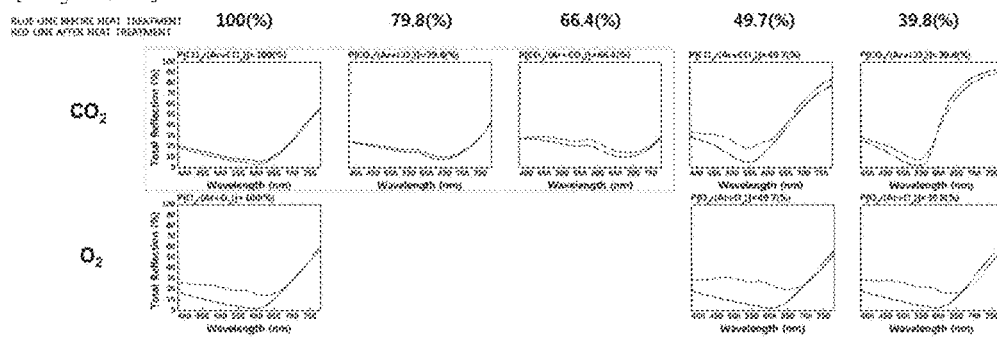

[Figure 5]
<BEFORE HEAT TREATMENT> Cu : O : C = 49.1 : 50.6 : 0.4 (at%)
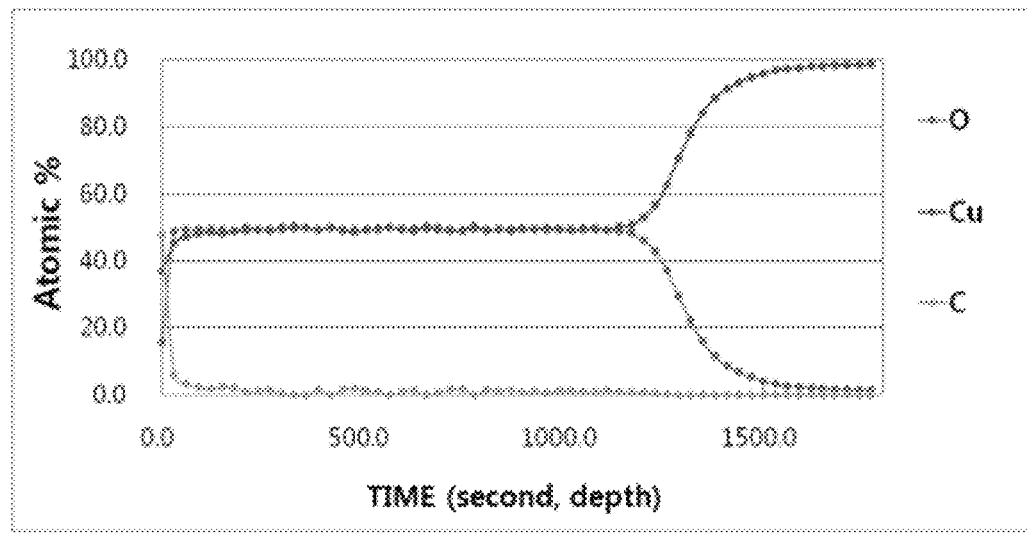
<AFTER HEAT TREATMENT> Cu : O : C = 49.6 : 49.4 : 1.0 (at%)
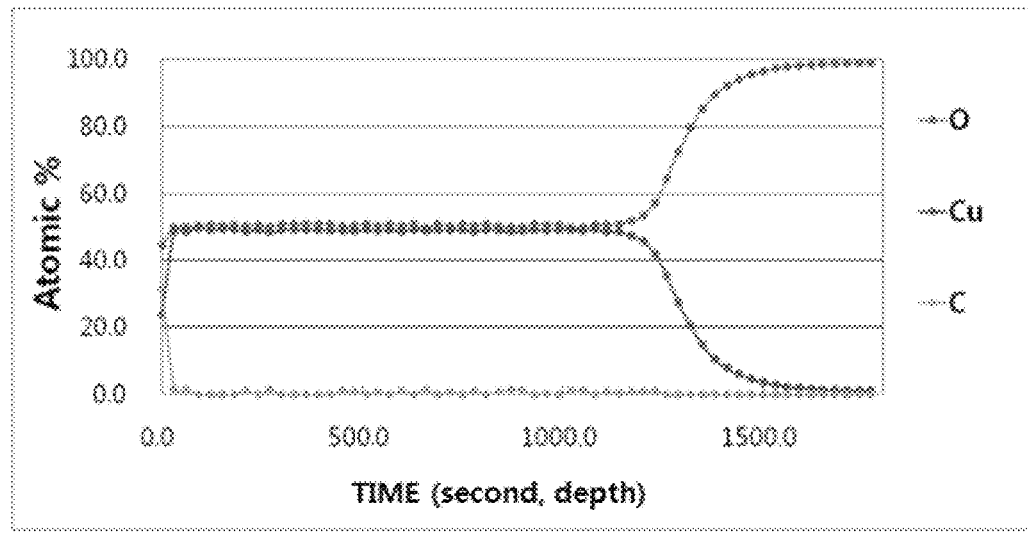

[Figure 6]
<BEFORE HEAT TREATMENT> Cu : O= 50 : 50 (at%)
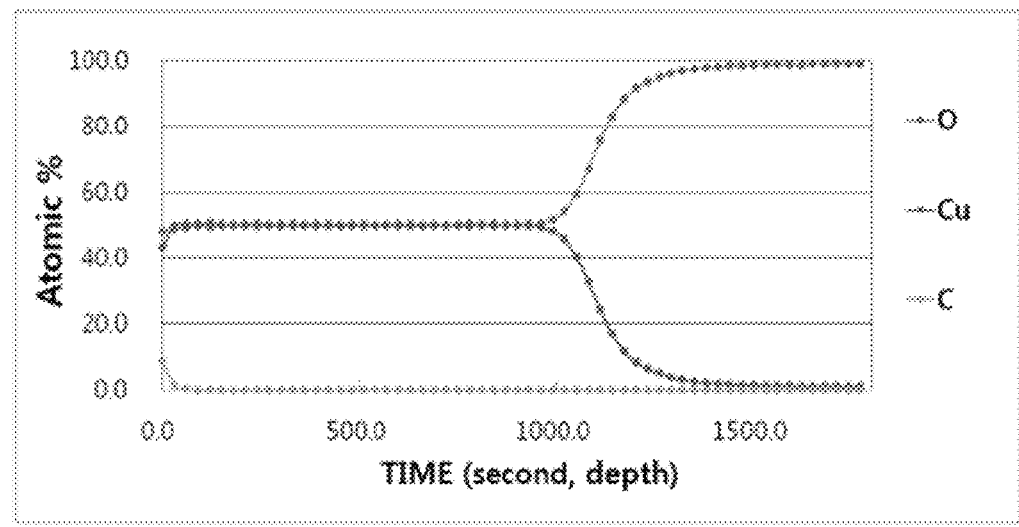
<AFTER HEAT TREATMENT> Cu : O= 49.4 : 50.6 (at%)
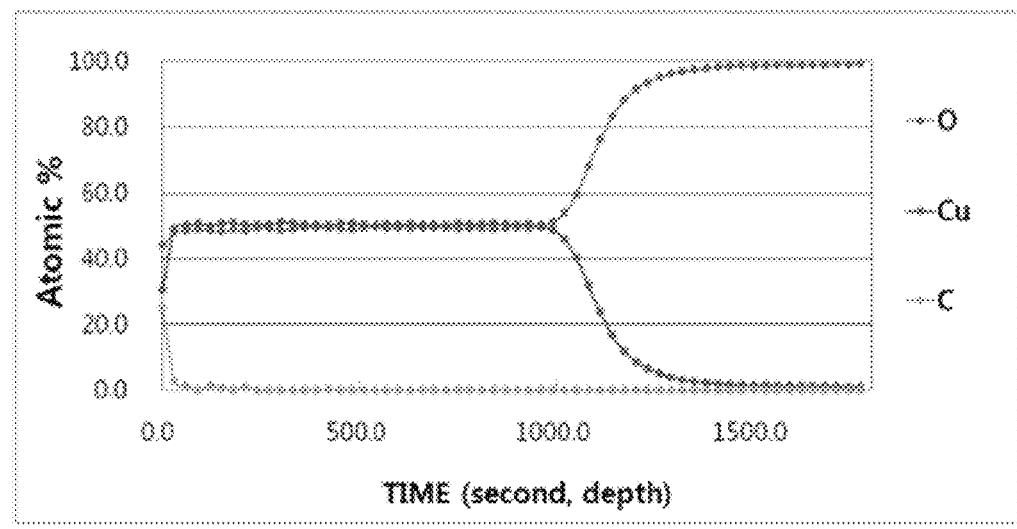

CONDUCTIVE STRUCTURE AND MANUFACTURING METHOD THEREOF

TECHNICAL FIELD

This application is a National Stage Entry of International Application No. PCT/KR2016/001403, filed on Feb. 11, 2016, and claims the benefit of and priority to Korean Application No. 10-2015-0020520, filed on Feb. 10, 2015, all of which are hereby incorporated by reference in their entirety for all purposes as if fully set forth herein.

The present application relates to a conductive structure body and a method for manufacturing the same.

BACKGROUND ART

In general, touch screen panels may be classified as follows according to a signal detection type. That is, there are a resistive type that detects a position pressed by pressure through a change in a current or voltage value while DC voltage is applied, a capacitive type using capacitance coupling while AC voltage is applied, an electromagnetic type that detects a selected position as a change in voltage while a magnetic field is applied, and the like.

Recently, as a need for a large-area touch screen panel is increased, development of technologies capable of implementing large touch screen panels having excellent visibility while reducing resistance of electrodes is required.

DETAILED DESCRIPTION OF THE INVENTION

Technical Problem

In the art, development of technologies for improving performance of various types of touch screen panels has been required.

Technical Solution

An exemplary embodiment of the present application provides a method for manufacturing a conductive structure body, including:
  forming a metal layer on a substrate, and
  forming a darkening layer on the metal layer,
  in which the forming of the darkening layer is performed by reactive sputtering using $CO_2$.

Another exemplary embodiment of the present invention provides a method for manufacturing a conductive structure body, including:
  forming a darkening layer on a substrate, and
  forming a metal layer on the darkening layer,
  in which the forming of the darkening layer is performed by reactive sputtering using $CO_2$.

Still another exemplary embodiment of the present invention provides a conductive structure body manufactured by the method for manufacturing the conductive structure body.

Yet another exemplary embodiment of the present invention provides a conductive structure body, including:
  a substrate;
  a metal layer provided on the substrate; and
  a darkening layer provided on at least one surface of the metal layer,
  in which the darkening layer includes $(CuO_x)_a C_b$, and x is in a range of $0 < x \leq 1$, $a+b=1$, and b is in a range of $0 < b \leq 0.1$.

Still yet another exemplary embodiment of the present invention provides an electronic device including the conductive structure body.

Advantageous Effects

The conductive structure body according to the exemplary embodiment of the present application does not influence conductivity of the conductive pattern and may prevent reflection by the conductive pattern and improve concealment of the conductive pattern by improving absorbance. Further, in the conductive structure body according to the exemplary embodiment of the present application, the darkening layer is formed by using reactive sputtering using $CO_2$, and as a result, as compared with a case of forming the darkening layer by using reactive sputtering using $O_2$ in the related art, it is possible to provide a stable darkening layer by suppressing high-temperature denaturation and provide an improved process even in terms of a deposition rate.

Further, it is possible to develop electronic devices such as a touch screen panel, a display device, and a solar cell with improved visibility using the conductive structure body according to the exemplary embodiment of the present invention.

BRIEF DESCRIPTION OF DRAWINGS

FIGS. 1 to 3 are diagrams illustrating schematically a stacked structure of a conductive structure body including a darkening layer according to an exemplary embodiment of the present application respectively.

FIG. 4 is a diagram illustrating a change in reflection before and after heat treatment according to a partial pressure ratio (%) of $CO_2$ reactive gas or $O_2$ reactive gas of conductive structure bodies in Example 1 and Comparative Example 1 according to an exemplary embodiment of the present application.

FIG. 5 is a diagram illustrating a composition profile of a darkening layer formed by reactive sputtering using $CO_2$ according to an exemplary embodiment of the present invention.

FIG. 6 is a diagram illustrating a composition profile of a darkening layer formed by reactive sputtering using $O_2$ in the related art.

EXPLANATION OF REFERENCE NUMERALS AND SYMBOLS

100: Substrate
200: Darkening layer
220: Darkening layer
300: Metal layer

BEST MODE

Hereinafter, the present invention will be described in more detail.

In this specification, a display device collectively refers to a TV, a computer monitor, or the like and includes a display element forming images and a case supporting the display element.

As the display element, a plasma display panel (PDP), a liquid crystal display (LCD), an electrophoretic display, a cathode-ray tube (CRT), an OLED display, and the like may be exemplified. In the display element, RGB pixel patterns and additional optical filters for implementing the image may be provided.

Meanwhile, with respect to the display device, as distribution of smart phones, tablet PCs, IPTVs, and the like is accelerated, a need for a touch function in which a human's hand become a direct input device without a separate input device such as a keyboard or a remote controller has been gradually increased. Further, a multi-touch function capable of handwriting as well as specific point recognition has been required.

Currently, most of commercialized touch screen panels (TSPs) are based on transparent conductive ITO thin films, but at the time of applying the large-area touch screen panel, there are problems in that a touch recognition speed is decreased because of RC relay due to a relatively high surface resistance (a minimum of 150 Ω/square, ELE-CRYSTA product by Nitto Denko Corporation) of an ITO transparent electrode itself and an additional compensation chip for overcoming the problem needs to be introduced.

The present inventors studied a technology for replacing the transparent ITO thin film with a metal fine pattern. As a result, the present inventors found that in the case of using a metal thin film having high electric conductivity as an electrode use of the touch screen panel, when a fine electrode pattern having a specific shape is implemented, in terms of visibility due to high reflectivity, a problem in that the pattern is well viewed by the human eye and glaring due to high reflectivity, a haze value, and the like against external light may occur. Further, in a manufacturing process, the present inventors found that a target value is expensive or the process is complicated in many cases.

Further, in the case of using a metal fine line as a transparent electrode, the largest problem may be a reflective color. Due to a unique gloss of metal, a visibility problem such as a glare caused by an external light source may occur, and thus an additional layer capable of reducing reflection needs to be formed on the metal surface.

In the case of a structure such as AlOxNy/Al which is a darkening structure in the related art, in spite of an excellent characteristic, a disadvantage due to low productivity is caused, and the present inventors introduced a Cu-based darkening structure.

In the case of using an electrode layer and a darkening layer based on Cu having a lower specific resistance value than Al, a thickness of a thin film for satisfying a surface resistance required for manufacturing a touch screen may be smaller, and particularly, in a sputtering process, since a Cu material has an excellent sputtering yield value about three times larger than that of Al, theoretically, a deposition rate may be improved about three times.

The Cu electrode may also be darkened using a Cu oxide, and a Cu electrode layer may be formed by a physical deposition method and a chemical deposition method, and CuO may also be formed by a method such as direct sputtering, reactive sputtering, evaporation deposition, and the like. However, when the Cu oxide is used as a material of the darkening layer, discoloration of the Cu darkening structure is observed when high temperature and high humidity are maintained, and as a result, a darkening function of the metal which is the original intention is deteriorated, and finally, a visibility problem of the touch screen may be caused. Further, in a high-temperature process and the like generated in a post process such as film heat treatment and a wired electrode adding process, a stability problem may be caused.

As a result, the present application provides a conductive structure body which may be differentiated from a touch screen panel using a conventional ITO-based transparent conductive thin film layer and applied to a touch screen panel with improved concealment of the metal fine pattern electrode and reflective and diffractive characteristics for external light.

Further, the present application provides a conductive structure body and a method for manufacturing the same capable of overcoming low productivity of a conventional reactive sputtering method using $O_2$, a discoloration problem at high temperature and high humidity, and the like.

The method for manufacturing the conductive structure body according to an exemplary embodiment of the present application includes forming a metal layer on a substrate and forming a darkening layer on the metal layer, in which the forming of the darkening layer is performed by reactive sputtering using $CO_2$.

Further, a method for manufacturing a conductive structure body according to another exemplary embodiment of the present application includes forming a darkening layer on a substrate and forming a metal layer on the darkening layer, in which the forming of the darkening layer is performed by reactive sputtering using $CO_2$. In this case, the method may further include forming the darkening layer on the metal layer.

In this specification, the darkening layer means a layer that may reduce an amount of light incident to the metal layer itself and light reflected from the metal layer due to absorption and the darkening layer may be expressed by terms of an absorbing layer, an absorption layer, a darkening layer, a darkness layer, and the like.

In the present application, the darkening layer may include at least one selected from a group consisting of metal oxide, metal nitride, and metal oxynitride, but is not limited thereto. In this case, the metal oxide, the metal nitride, and the metal oxynitride may include at least one metal selected from a group consisting of Fe, Co, Ti, V, Al, Au, Cu and Ag, but are not limited thereto. According to the exemplary embodiment of the present application, the darkening layer may additionally include a dielectric material such as SiO, $SiO_2$, $MgF_2$, and SiNx (x is an integer of 1 or more) in addition to the metal oxide, the metal nitride, and the metal oxynitride described above.

Particularly, the darkening layer may include $(CuO_x)_aC_b$, and in this case, x may be in a range of $0<x\leq 1$, $a+b=1$, and b may be in a range of $0<b\leq 0.1$.

In the method for manufacturing the conductive structure body according to the present application, the darkening layer is formed by using reactive sputtering using $CO_2$, and as a result, as compared with a case of forming the darkening layer by using conventional reactive sputtering using $O_2$, it is possible to provide a stable darkening layer by suppressing high-temperature denaturation and provide an improved process even in terms of a deposition rate.

According to the method for manufacturing the conductive structure body according to the present application, reactive sputtering may be performed by simultaneously injecting $CO_2$ and Ar when forming the darkening layer. In this case, a partial pressure of $CO_2$ may be 66% or more, 80% or more, and 90% or more, but is not limited thereto. Further, in the darkening layer, a small amount of C may be contained, and more particularly, the content of C in the darkening layer may be less than 0.3 wt %, but is not limited thereto.

In the present application, the substrate may use a transparent substrate, and is not particularly limited, and for example, the substrate may use glass, a plastic substrate, a plastic film, and the like.

In the present application, a material of the metal layer may be a metal material having excellent electric conductivity and easy etching. However, generally, a material having excellent electric conductivity has a disadvantage of high reflectivity. However, in the present application, the darkening layer is used to form the metal layer by using a material having high reflectivity. In the present application, even in the case of using a material having reflectivity of 70 to 80% or more, the darkening layer is added to reduce reflectivity, improve concealment of the metal layer, and maintain or improve a contrast characteristic.

A detailed example of the material of the metal layer may be a single layer or a multilayer containing at least one of copper, aluminum, silver, neodymium, molybdenum, nickel, and alloys thereof, and more preferably copper or aluminum, but is not limited thereto.

Further, the metal layer and the darkening layer may include different metal atoms and also include the same metal atoms.

In the present application, the forming of the metal layer may be performed by using a method known in the art. For example, the metal layer may be formed by a method such as direct sputtering, reactive sputtering, evaporation deposition, and the like, but is not limited thereto.

In the present application, a process of respectively or simultaneously patterning the metal layer and the darkening layer may be additionally included.

That is, in the method for manufacturing the conductive structure body according to the exemplary embodiment of the present application, the metal layer is formed on the substrate, a metal pattern is formed by patterning the metal layer, and then a darkening layer or a darkening pattern may be formed on the metal pattern. Further, in the method for manufacturing the conductive structure body according to another exemplary embodiment of the present application, the metal layer is formed on the substrate, a darkening layer is formed on the metal layer, and then a metal pattern and a darkening pattern may be formed by simultaneously patterning the metal layer and the darkening layer.

Further, in the method for manufacturing the conductive structure body according to the exemplary embodiment of the present application, a darkening layer is formed on the substrate, a darkening pattern is formed by patterning the darkening layer, and then a metal layer or a metal pattern may be formed on the darkening pattern. Further, in the method for manufacturing the conductive structure body according to another exemplary embodiment of the present application, a darkening layer is formed on the substrate, a metal layer is formed on the darkening layer, and then a metal pattern and a darkening pattern may be formed by simultaneously patterning the metal layer and the darkening layer.

In the present application, a line width of the metal pattern may be more than 0 μm and 10 μm or less, particularly 0.1 μm or more and 10 μm or less, more particularly 0.2 μm or more and 8 μm or less, and much more particularly 0.5 μm or more and 5 μm or less.

In the present application, an aperture ratio of the metal pattern, that is, an area ratio which is not covered by the pattern may be 70% or more, 85% or more, and 95% or more. Further, the aperture ratio of the metal pattern may be 90 to 99.9%, but is not limited thereto.

In the present application, the metal pattern may be a regular pattern and an irregular pattern.

As the regular pattern, a pattern form in the art such as a mesh pattern may be used. The irregular pattern is not particularly limited, but may be a boundary line form of figures consisting of a Voronoi diagram. In the present application, in the case of using the irregular pattern and the darkening pattern together, a diffractive pattern of reflective light by directional lighting may be removed by the irregular pattern and an effect by scattering of light may be minimized by the darkening pattern, and as a result, the problem in the visibility may be minimized.

In the present application, the metal pattern includes an edge structure of closed figures which are continuously connected, and the metal pattern does not have closed figures in the same form within any unit area (1 cm×1 cm), and the number of apexes in the closed figures may be different from the number of apexes in quadrangles having the same number as the closed figures.

The number of apexes in the closed figures is different from the number of apexes in quadrangles having the same number as the closed figures. More particularly, the number of apexes in the closed figures may be greater or 1.9 to 2.1 times greater than the number of apexes in quadrangles having the same number as the closed figures, but is not limited thereto.

In the present application, the closed figures are continuously connected to each other, and for example, when the closed figures are polygons, adjacent closed figures may share at least one side.

In the present application, the metal pattern includes an edge structure of closed figures which are continuously connected, and the metal pattern does not have closed figures in the same form within any unit area (1 cm×1 cm), and the number of apexes in the closed figures may be different from the number of apexes in polygons formed by connecting shortest distances between the gravity centers of the closed figures.

The number of apexes in the closed figures is different from the number of apexes of polygons formed by connecting shortest distances between the gravity centers of the closed figures. More particularly, the number of apexes in the closed figures may be greater or 1.9 to 2.1 times greater than the number of apexes of polygons formed by connecting shortest distances between the gravity centers of the closed figures, but is not limited thereto.

In the present application, the metal pattern includes an edge structure of closed figures which are continuously connected, and the metal pattern does not have closed figures in the same form within any unit area (1 cm×1 cm), and in the closed figures, a value in Equation 3 below may be 50 or more.

$$(\text{Standard deviation of distances between apexes/average of distances between apexes}) \times 100 \quad [\text{Equation 3}]$$

In the present application, when an image of a transmissive diffraction pattern is obtained by irradiating straight light emitted from a light source to one surface of the metal pattern, in the image, a value of Equation 4 below may be less than 21.

$$(\text{Standard deviation of intensity of transmissive diffraction pattern depending on angle region/average intensity of transmissive diffraction pattern depending on angle region}) \times 100 \quad [\text{Equation 4}]$$

In Equation 4, the angle region means a region in which 0 to 360° are divided by each 10° from the image center of the transmissive diffraction pattern.

When the image of the transmissive diffraction pattern is obtained, in the image, a value in Equation 4 may be less than 21, 15 or less, and 10 or less.

In the present application, the metal pattern includes an edge structure of closed figures which are continuously connected to each other and the edge structure of the closed figures may be modified in various forms such as a straight line, a curved line, a zigzag, and combinations thereof.

In the present application, the metal pattern may not have the same closed figures in a unit area.

In the present application, the conductive pattern includes an edge structure of closed figures which are continuously connected, and when angles formed between lines configuring the edges of the closed figures and any straight line are divided by a unit of 10° at 0 to 180°, with respect to the number of lines within each angle range, a value of Equation 5 below may be less than 21, 15 or less, and 10 or less.

(Standard deviation of the number of lines in angle range/average of the number of lines in angle range)×100      [Equation 5]

In the present application, in the metal pattern, the values in Equations 3 to 5 may be calculated within a unit area of the electric conductive pattern. The unit area may be an area formed with the metal pattern and for example, 3.5 cm×3.5 cm, but is not limited thereto.

The apexes will be defined to mean points at which lines configuring the edge of the closed figures of the metal pattern cross each other.

As such, the pattern is formed to implement a fine metal pattern required in the touch screen. In the touch screen, when the fine metal pattern is not implemented, physical properties required in the touch screen such as resistance and the like may not be achieved.

In the present application, the metal pattern may be a form of the edge structure of the closed figures formed by disposing any points in a regularly arranged unit cell and connecting the points with the closest points from distance from other points.

In this case, in the case of introducing irregularity to a method of disposing any points in the regularly arranged unit cell, the metal pattern according to the exemplary embodiment of the present application may be formed. For example, when the irregularity is 0, the metal pattern has a square mesh structure when the unit cell is a square and the metal pattern has a honeycomb structure when the unit cell is a regular hexagon.

By the metal pattern of the irregular pattern form according to the exemplary embodiment of the present application, a coverage phenomenon of lines configuring the pattern may be suppressed, uniform transmittance may be obtained from the display, and the linear density of the unit area may be maintained at the same level, and uniform conductivity may be ensured.

In the present application, in the metal pattern, the number of apexes of the closed figures within a unit area (3.5 cm×3.5 cm) may be 6,000 or more, 7,000 or more, 15,000 or more, and 245,000 or less, but may be adjusted depending on transmittance and conductivity desired by those skilled in the art.

In the present application, the line width of the metal pattern is 10 μm or less and in the metal pattern, the number of apexes of closed figures in an area of 3.5 cm×3.5 cm may be 6,000 to 245,000. Further, the line width of the metal pattern is 7 μm or less and in the metal pattern, the number of apexes of closed figures in an area of 3.5 cm×3.5 cm may be 7,000 to 62,000. Further, the line width of the metal pattern is 5 μm or less and in the metal pattern, the number of apexes of closed figures in an area of 3.5 cm×3.5 cm may be 15,000 to 62,000.

At least one of the figures configuring the pattern in the unit area may have a different form from other figures.

In the present application, sides of the darkening pattern and the metal pattern may have forward tapered angles, but the darkening pattern positioned on an opposite side to the substrate of the metal pattern or the metal pattern may have a reversed tapered angle.

Further, another exemplary embodiment of the present application provides a conductive structure body manufactured by the method for manufacturing the conductive structure body.

Further, still another exemplary embodiment of the present application provides a conductive structure body including a substrate, a metal layer provided on the substrate, and a darkening layer provided on at least one surface of the metal layer.

Particularly, the darkening layer of the conductive structure body includes $(CuO_x)_aC_b$, and x is in a range of $0<x\leq1$, a+b=1, and b is in a range of $0<b\leq0.1$.

An example of the conductive structure body according to the exemplary embodiment of the present application is illustrated in FIGS. 1 to 3 below. FIGS. 1 to 3 are to exemplify a laminated sequence of the substrate, the metal layer and the darkening layer, and the metal layer and the darkening layer may have patterned shapes rather than the entire surface layer when being actually applied for a fine transparent electrode of the touch screen panel and the like.

Referring to FIG. 1, it is illustrated that a darkening layer 200 is disposed between a substrate 100 and a metal layer 300. When a user views the touch screen panel from the substrate side, reflectivity by the metal layer may be largely reduced.

Referring to FIG. 2, it is illustrated that the darkening layer 200 is disposed on the metal layer 300. When a user views the touch screen panel from an opposite surface of the substrate side, reflectivity by the metal layer may be largely reduced.

Referring to FIG. 3, it is illustrated that the darkening layers 200 and 220 are disposed between the substrate 100 and the metal layer 300 and on the metal layer 300. When the user views the touch screen panel from the substrate side and from the opposite side thereof, reflectivity by the metal layer may be largely reduced.

In a structure of the conductive structure body according to the exemplary embodiment of the present application, the darkening layer may be provided on at least one surface of the metal layer.

The structure of the conductive structure body according to the exemplary embodiment of the present application may be a structure in which the substrate, the darkening layer, the metal layer, and the darkening layer are sequentially stacked. Further, the conductive structure body may additionally include a metal layer and a darkening layer on the outermost darkening layer.

That is, the structure of the conductive structure body according to the exemplary embodiment of the present application may be a structure of substrate/darkening layer/metal layer, a structure of substrate/metal layer/darkening layer, a structure of substrate/darkening layer/metal layer/darkening layer, a structure of substrate/metal layer/darkening layer/metal layer, a structure of substrate/darkening layer/metal layer/darkening layer/metal layer/darkening layer, a structure of substrate/darkening layer/metal layer/darkening layer/metal layer/darkening layer/metal layer/darkening layer, and the like.

In the exemplary embodiment of the present application, the surface resistance of the conductive structure body may be 1 Ω/square or more and 300 Ω/square or less, particularly 1 Ω/square or more and 100 Ω/square or less, more particularly 1 Ω/square or more and 50 Ω/square or less, and much more particularly 1 Ω/square or more and 20 Ω/square or less.

If the surface resistance of the conductive structure body is 1 Ω/square or more and 300 Ω/square or less, there is an effect of replacing an ITO transparent electrode in the related art. When the surface resistance of the conductive structure body is 1 Ω/square or more and 100 Ω/square or less or 1 Ω/square or more and 50 Ω/square or less, particularly, 1 Ω/square or more and 20 Ω/square or less, the surface resistance is significantly low as compared with when the ITO transparent electrode in the related art is used. Thus, there are advantages in that when a signal is applied, the RC delay becomes shorter, and as a result, the touch recognition speed may be significantly improved and a touch screen having a large area of 10 inches or more is easily applied.

The surface resistance of the metal layer or the darkening layer before patterning in the conductive structure body may be more than 0 Ω/square and 2 Ω/square or less and particularly, more than 0 Ω/square and 0.7 Ω/square or less. When the surface resistance is 2 Ω/square or less, particularly, 0.7 Ω/square or less, as the surface resistance of the metal layer or the darkening layer before patterning is lowered, a fine patterning design and a manufacturing process are easily performed, and the surface resistance of the conductive structure body after patterning is lowered and thus, there is an effect of increasing a reaction rate of the electrode. The surface resistance may be adjusted depending on a thickness of the metal layer or the darkening layer.

In the conductive structure body according to the exemplary embodiment of the present invention, a mean extinction coefficient k in a visible light area may be 0.2 to 1.5 and particularly 0.4 to 1.0. When the mean extinction coefficient k is 0.2 or more, there is an effect of enabling darkening. The mean extinction coefficient k is called an absorption coefficient and an element of determining transmittance of the conductive structure body, as a measure capable of defining how strong the conductive structure body absorbs light in a predetermined wavelength. For example, in the case of a transparent dielectric material, k<0.2, and a k value is very small. However, as a metal component is increased in the material, the k value is increased. If the metal component is further increased, the metal component becomes a metal in which transmittance hardly occurs and only surface reflection mostly occurs, and the extinction coefficient k is more than 1.5 and thus, it is not preferred in the formation of the darkening layer.

In the exemplary embodiment of the present invention, in the conductive structure body, a mean refractive index in the visible light area may be 2 to 3.

In this specification, the visible light area means an area having a wavelength of 360 to 820 nm.

In the exemplary embodiment of the present invention, the thickness of the darkening layer may be 20 nm to 60 nm, particularly 25 nm to 50 nm, and more particularly 30 nm to 50 nm. A preferable thickness of the darkening pattern may vary according to a used material and a manufacturing process, but considering an etching characteristic, when the thickness is less than 20 nm, the process may not be easily adjusted and when the thickness is more than 60 nm, it may be disadvantageous in terms of production rate. Particularly, when the thickness is 25 nm or more and 50 nm or less and more particularly 30 nm to 50 nm, the process is easily adjusted and the production rate is improved, and thus it may be more advantageous in the manufacturing process. In this case, reflection is further reduced and the darkening layer is further formed well, and thus there is a more advantageous effect.

In the exemplary embodiment of the present invention, a total reflection of the darkening layer may be 20% or less, particularly 15% or less, more particularly 10% or less, much more particularly 5% or less, and 3% or less. As the total reflection is smaller, the effect is better.

The total reflection may be measured in an opposite direction to a surface where the darkening layer contacts the metal layer. The total reflection measured in the direction may be 20% or less, particularly 15% or less, more particularly 10% or less, and much more particularly 5% or less, and 3% or less. The reflection is smaller, the effect is better.

Further, the darkening layer is provided between the metal layer and the substrate and the total reflection may be measured in the substrate side. When the total reflection is measured in the substrate side, the total reflection may be 20% or less, particularly 15% or less, more particularly 10% or less, and much more particularly 5% or less, and 3% or less. As the total reflection is smaller, the effect is better.

In this specification, the total reflection means reflection to light at a wavelength of 300 to 800 nm, particularly 380 to 780 nm, and more particularly 550 nm which is incident at 90° to the surface to be measured after an opposite surface to the surface to be measured is treated with perfect black.

In the exemplary embodiment of the present invention, in the conductive structure body, the total reflection of the darkening layer may be 20% or less, particularly 15% or less, and more particularly 10% or less, and much more particularly 6% or less. As the total reflection is smaller, the effect is better.

In this specification, the total reflection may be a value measured based on a wavelength value of 300 to 680 nm, particularly 450 to 650 nm, and more particularly 550 nm of reflection light reflected by a target pattern layer or a conductive structure body to which the light is incident when incident light is 100%.

In the conductive structure body according to the exemplary embodiment of the present invention, the darkening pattern may include a first surface contacting the metal pattern and a second surface facing the first surface. When the total reflection of the conductive structure body is measured at the second surface side of the darkening pattern, the total reflection Rt of the conductive structure body may be calculated by the following Equation 1.

$$\text{Total reflection } Rt = \text{reflection of substrate} + \text{closure rate} \times \text{reflection of darkening pattern} \quad \text{[Equation 1]}$$

Further, when the configuration of the conductive structure body is a case where two types of conductive structure bodies are laminated, the total reflection Rt of the conductive structure body may be calculated by the following Equation 2.

$$\text{Total reflection } Rt = \text{reflection of substrate} + \text{closure rate} \times \text{reflection of darkening pattern} \times 2 \quad \text{[Equation 2]}$$

In Equations 1 and 2, the reflection of the substrate may be reflection of touch reinforced glass and when the surface is a film, the reflection of the substrate may be the reflection of the film.

Further, the closure rate may be represented by an area ratio, that is, (1-aperture ratio) occupied by a region covered by the metal pattern based on the plane of the conductive structure body.

Accordingly, a difference between a case with the darkening pattern and a case without the darkening layer depends on the reflection of the darkening layer. In this aspect, the total reflection Rt of the conductive structure body according to the exemplary embodiment of the present application may be decreased by 10 to 20%, 20 to 30%, 30 to 40%, 40 to 50%, and 50 to 70% as compared with the total reflection $R_0$ of the conductive structure body having the same configuration except that there is no darkening pattern. That is, in Equations 1 and 2, while the range of the closure rate is changed to 1 to 10%, when the range of the total reflection is changed up to 1 to 30%, an effect of reducing the total reflection of maximum 70% may be shown and an effect of reducing the total reflection of minimum 10% may be shown.

In the conductive structure body according to the exemplary embodiment of the present application, the darkening pattern includes a first surface contacting the metal pattern and a second surface facing the first surface. When the total reflection of the conductive structure body is measured at the second surface side of the darkening pattern, a difference between the total reflection Rt of the conductive structure body and the total reflection $R_0$ of the substrate may be 40% or less, 30% or less, 20% or less, and 10% or less.

In the exemplary embodiment of the present application, the conductive structure body may have a contrast value L* of 50 or less and more particularly 20 or less based on the Commission Internationale de l'Eclairage (CIE) L*a*b* color coordinate. As the contrast value is decreased, the total reflection is decreased, and thus it is advantageous.

Further, in the conductive structure body according to the exemplary embodiment of the present application, the darkening pattern may be directly provided on the substrate or the metal pattern without interposing an adhesive layer or an adhering layer. The adhesive layer or the adhering layer may have an effect on durability or an optical property. Further, a manufacturing method for the conductive structure body according to the exemplary embodiment of the present application is completely different from the case of using the adhesive layer or the adhering layer. Further, as compared with the case of using the adhesive layer or the adhering layer, in the exemplary embodiment of the present application, an interface characteristic between the substrate or the metal pattern and the darkening pattern is excellent.

In the exemplary embodiment of the present application, the darkening pattern may be formed by a single layer or two or more layers.

In the exemplary embodiment of the present application, the darkening pattern may have an achromatic color. In this case, the achromatic color means a color displayed when light incident to the surface of an object is not selectively absorbed, but evenly reflected and absorbed at a wavelength of each component.

Yet another exemplary embodiment of the present invention provides an electronic device including the conductive structure.

The electronic device may include a touch screen panel, a display device, a solar cell, and the like, but is not limited thereto.

More particularly, for example, in a capacitive touch screen panel, the conductive structure body according to the exemplary embodiment of the present invention may be used as a touch sensitive electrode substrate.

The touch screen panel may further include an additional structure body other than the conductive structure body including the substrate, the metal layer, and the darkening layer. In this case, two structure bodies may be disposed in the same direction, or may be disposed in directions opposite to each other. Two or more structure bodies that may be included in the touch screen panel of the present invention need not to have the same structure, and any one, preferably, only the structure body closest to the user may include the substrate, the metal layer, and the darkening layer and the additional structure body may not include the patterned darkening layer. Further, layer-laminated structures in the two or more structure bodies may be different from each other. When two or more structure bodies are included, an insulating layer may be provided therebetween. In this case, the insulating layer may additionally have a function as an adhesive layer.

The touch screen panel according to the exemplary embodiment of the present application may include a lower substrate; an upper substrate; and an electrode layer provided on any one surface or both surfaces of a surface of the lower substrate contacting the upper substrate and a surface of the upper substrate contacting the lower substrate. The electrode layers may perform a function for detecting an X-axial position and a Y-axial position, respectively.

In this case, one or both of the electrode layer provided on the lower substrate and the surface of the lower substrate contacting the upper substrate; and the electrode layer provided on the upper substrate and the surface of the upper substrate contacting the lower substrate may be the conductive structure body according to the aforementioned exemplary embodiment of the present application. In the case where only one of the electrode layers is the conductive structure body according to the present application, the other electrode layer may have a metal pattern which is known in the art.

In the case where the electrode layers are provided on one surfaces of both the upper substrate and the lower substrate to form an electrode layer of two layers, an insulating layer or a spacer may be provided between the lower substrate and the upper substrate so that a distance between the electrode layers is uniformly maintained and the electrode layers are not connected to each other. The insulating layer may include an adhesive or a UV or thermosetting resin. The touch screen panel may further include a ground portion connected to the metal pattern in the aforementioned conductive structure body. For example, the ground portion may be formed at an edge of the surface with the metal pattern of the substrate. Further, at least one of an anti-reflective film, a polarization film, and an anti-fingerprinting film may be provided on at least one surface of a laminate including the conductive structure body. According to a design specification, different kinds of functional films may further be included in addition to the aforementioned functional films. As described above, the touch screen panel may be applied to display devices such as an OLED display panel (PDP), a liquid crystal display (LCD), a cathode-ray tube (CRT), and a PDP.

In the touch screen panel according to the exemplary embodiment of the present application, the metal pattern and the darkening pattern may be provided on two surfaces of the substrate, respectively.

The touch screen panel according to the exemplary embodiment of the present application may additionally include an electrode portion or a pad portion on the conductive structure body. In this case, an effective screen portion, the electrode portion, and the pad portion may be configured by the same conductive body.

In the touch screen panel according to the exemplary embodiment of the present application, the darkening pattern may be provided at a side viewed by the user. Further, in display device, the conductive structure body according to the exemplary embodiment of the present application may be used in a color filter substrate, a thin film transistor substrate, or the like.

Further, the solar cell may include an anode electrode, a cathode electrode, a photoactive layer, a hole transporting layer and/or an electron transporting layer, and the conductive structure body according to the exemplary embodiment of the present application may be used as the anode electrode and/or the cathode electrode.

The conductive structure body may replace conventional ITO in the display device or the solar cell and may be used as a flexible application. Further, the conductive structure body may be used as a next-generation transparent electrode together with CNT, a conductive polymer, graphene, or the like.

Hereinafter, the present invention will be described in more detail with reference to Examples, Comparative Examples, and Experimental Examples. However, Examples, Comparative Examples and Experimental Examples below are to just exemplify the present invention and the scope of the present invention is not limited thereto.

EXAMPLES

Example 1

A conductive structure body in Example 1 was manufactured by forming a Cu layer having a thickness of 60 nm as a conductive layer on a polyethylene terephthalate (PET) substrate by a DC sputtering method using a CU single target and forming a darkening layer including $CuO_x$ ($0<x<1$) having a thickness of 35 nm and containing a small amount (less than 0.3 wt %) of C by a $CO_2$ reactive sputtering method in the CU single target. In this case, at partial pressure of $CO_2$: Ar gas of 0% to 100%, an experiment was performed, and at partial pressure of 66% or more, a target material may be formed. Discharge voltage used for deposition was 150 W, a 3-inch sputtering device was used, and when the discharge voltage was converted, the discharge voltage was at about 3.29 $W/cm^2$. The process pressure during deposition was maintained at about 3 mTorr.

Comparative Example 1

A conductive structure body in Comparative Example 1 was manufactured by forming a Cu layer having a thickness of 60 nm as a conductive layer on a polyethylene terephthalate (PET) substrate by a DC sputtering method using a CU single target and forming a darkening layer including $CuO_x$ ($0<x<1$) having a thickness of 35 nm by a $O_2$ reactive sputtering method in the CU single target. In this case, at partial pressure of $O_2$: Ar gas of 0% to 100%, an experiment was performed, and at partial pressure of 20% or more, a target material may be formed. Discharge voltage used for deposition was 150 W, a 3-inch sputtering device was used, and when the discharge voltage was converted, the discharge voltage was at about 3.29 $W/cm^2$. The process pressure during deposition was maintained at about 3 mTorr.

Experimental Example

1) Change in Reflection Before and After Heat Treatment

Changes in reflection before and after heat treatment according to a partial pressure ratio (%) of $CO_2$ reactive gas or a partial pressure ratio (%) of $O_2$ reactive gas of the conductive structure bodies manufactured in Example 1 and Comparative Example 1 were illustrated in FIG. 4 below.

The partial pressure ratio (%) at the top of FIG. 4 below means a partial pressure ratio of $CO_2/O_2$ and Ar. In this case, a heat treatment condition was 150° C. and 30 minutes.

According to the result of FIG. 4 below, it can be seen that in the case of using the $CO_2$ reactive gas, there is little change in reflection before and after heat treatment like the present application.

2) Composition Profile of Darkening Layer

FIG. 5 illustrates a composition profile of the darkening layer before and after heat treatment in the conductive structure body manufactured in Example 1 and FIG. 6 illustrates a composition profile of the darkening layer before and after heat treatment in the conductive structure body manufactured in Comparative Example 1. In this case, a heat treatment condition was 150° C. and 30 minutes.

3) Deposition Rate

When manufacturing the conductive structure bodies of Example 1 and Comparative Example 1, deposition rates according to a type of reactive gas were evaluated and illustrated in Table 1 below.

TABLE 1

| Reactive gas/(Ar + reactive gas) (%) @ DC 3.29 ($W/cm^2$), 3 mTorr | Deposition rate (nm/min) | |
|---|---|---|
| | Example 1 | Comparative Example 1 |
| 100 | 10.4 | 4.0 |
| 79.8 | 16.9 | X |
| 66.4 | 19.5 | X |
| 49.7 | 23.6 | 8.3 |
| 39.8 | 28.1 | 16.3 |
| 16.8 | 31.7 | 38.1 |
| 15.5 | X | 34.1 |
| 8.8 | X | 31.8 |
| 0 | 34.0 | 34.0 |

As the result, the conductive structure body according to the exemplary embodiment of the present application does not influence conductivity of the conductive pattern and may prevent reflection by the conductive pattern and improve concealment of the conductive pattern by improving absorbance. Further, in the conductive structure body according to the exemplary embodiment of the present application, the darkening layer is formed by using reactive sputtering using $CO_2$, and as a result, as compared with a case of forming the darkening layer by using conventional reactive sputtering using $O_2$, it is possible to provide a stable darkening layer by suppressing high-temperature denaturation and provide an improved process even in terms of a deposition rate.

Further, it is possible to develop electronic devices such as a touch screen panel, a display device, and a solar cell with improved visibility using the conductive structure body according to the exemplary embodiment of the present application.

The invention claimed is:

1. A method for manufacturing a conductive structure body, comprising:
   forming a metal layer on a substrate, and forming a darkening layer on the metal layer; or forming a darkening layer on a substrate, and forming a metal layer on the darkening layer,
   wherein the forming of the darkening layer is performed by reactive sputtering using $CO_2$, and
   wherein the darkening layer includes $(CuO_x)_aC_b$, and x is in a range of $0<x\leq1$, $a+b=1$, and b is in a range of $0<b\leq0.1$.

2. The method of claim 1, wherein when the darkening layer is formed, the reactive sputtering is performed by injecting $CO_2$ and Ar at the same time.

3. The method of claim 2, wherein a partial pressure of $CO_2$ is 66% or more.

4. The method of claim 1, wherein the darkening layer includes at least one selected from a group consisting of metal oxide, metal nitride and metal oxynitride.

5. The method of claim 4, wherein the metal oxide, the metal nitride or the metal oxynitride includes at least one metal selected from a group consisting of Fe, Co, Ti, V, Al, Au, Cu, Ag and alloys thereof.

6. The method of claim 4, wherein the metal layer and the darkening layer include the same metal atom.

7. The method of claim 1, further comprising:
patterning the metal layer and the darkening layer, respectively or simultaneously.

8. A conductive structure body manufactured by the method for manufacturing the conductive structure body of claim 1.

9. A conductive structure body, comprising;
a substrate;
a metal layer provided on the substrate; and
a darkening layer provided on at least one surface of the metal layer,
wherein the darkening layer includes $(CuO_x)_a C_b$, and x is in a range of $0<x\leq1$, $a+b=1$, and b is in a range of $0<b\leq0.1$.

10. The conductive structure body of claim 9, wherein a total reflection measured in an opposite direction to a surface of which the darkening layer contacts the metal layer is 20% or less.

11. The conductive structure body of claim 9, wherein the darkening layer is provided between the metal layer and the substrate and a total reflection measured at the substrate side is 20% or less.

12. The conductive structure body of claim 9, wherein a surface resistance of the conductive structure body is 1 $\Omega$/square or more and 300 $\Omega$/square or less.

13. The conductive structure body of claim 9, wherein a mean extinction coefficient k in a visible light area of the conductive structure body is 0.4 to 1.0.

14. The conductive structure body of claim 9, wherein a contrast value L* is 50 or less based on the CIE L*a*b* color coordinate.

15. An electronic device including the conductive structure body of claim 9.

* * * * *